United States Patent [19]

Lightstone et al.

[11] Patent Number: 4,654,678
[45] Date of Patent: Mar. 31, 1987

[54] AVALANCHE PHOTODIODE

[75] Inventors: Alexander W. Lightstone; Paul P. Webb; Robert J. McIntyre, all of Quebec, Canada

[73] Assignee: RCA, Inc., Ste-Anne-de-Bellevue, Canada

[21] Appl. No.: 771,356

[22] Filed: Aug. 30, 1985

[51] Int. Cl.$^4$ ............................................ H01L 29/90
[52] U.S. Cl. .................................... 357/13; 357/30; 357/55
[58] Field of Search ............... 357/13, 13 PT, 13 LM, 357/13 U, 20, 52, 90, 55, 30

[56] References Cited

U.S. PATENT DOCUMENTS

| | | | |
|---|---|---|---|
| 3,403,306 | 9/1958 | Haitz et al. | 357/13 X |
| 3,714,491 | 1/1973 | McIntyre et al. | 313/96 |
| 4,129,878 | 12/1978 | Webb | 357/13 |
| 4,383,267 | 5/1983 | Webb | 357/13 X |
| 4,586,066 | 4/1986 | McIntyre | 357/56 X |
| 4,586,067 | 4/1986 | Webb | 357/13 X |

OTHER PUBLICATIONS

Kennedy et al., IRE Transactions on Electron Devices, ED-9 478 (1962).

Primary Examiner—Martin H. Edlow
Assistant Examiner—Sara W. Crane
Attorney, Agent, or Firm—B. E. Morris; W. J. Burke

[57] ABSTRACT

The invention is an improved avalanche photodiode having reduced electrical noise arising from spurious surface generation of charge carriers. The avalanche photodiode includes active and neighboring regions adjacent a first surface of a semiconductor body with a gap region therebetween and a channel extending a distance into the semiconductor body from a portion of the second opposed surface opposite the gap region. A P-N junction is formed between regions of opposite conductivity type including a portion thereof over the channel. Since the dopant concentration at the junction is less over the channel, the local avalanche gain over the channel is less, thereby reducing the noise contribution from carriers generated in the gap region.

5 Claims, 2 Drawing Figures

AVALANCHE PHOTODIODE

The invention is an improved guard band avalanche photodiode having reduced electrical noise and a method of making this photodiode.

BACKGROUND OF THE INVENTION

An avalanche photodiode is a light detector which typically comprises a $\pi$-type conductivity substrate having an N-type region extending a distance into the substrate from a second major surface thereof and a P-type region extending a further distance into the substrate from the N-type region, thereby forming a P-N junction. A P+-type conductivity contacting region extends a distance into the substrate from a first major surface thereof to provide a layer suitable for electrical contact. Upon application of a reverse bias voltage to this photodiode the depletion region of the diode, i.e., that region having no free electrical charge, reaches through to the $\pi$-type substrate region which the peak electrical field at the P-N junction is between about 5 and 10 percent less than that required to produce an avalanche breakdown. A further increase in the applied voltage causes the depletion region to increase rapidly towards the P+-type region, while the electric field throughout the device increases relatively slowly.

Electrical isolation at the first major surface is achieved by separating the P+-type region into two separate regions, an inner active region and a neighboring guard-band region. Webb, in U.S. Pat. No. 4,129,878, has disclosed that carrier injection from the first major surface between the inner and outer regions produces injected carriers which increase the noise in the photodiode. Webb also discloses that carrier injection can be reduced by forming a P−-type region in the gap between the inner and outer regions. With this structure, very high isolation between inner and outer regions is achieved only when sufficient bias voltage is applied to fully deplete the P−-type region in the gap. Experience has shown, however, that under these conditions if this gap is opposite a region of high gain, carrier generation at the surface produces injection into the high gain region thereby producing additional undesirable noise.

Thus, it would be desirable to have an improved avalanche photodiode structure which reduces the effect of carrier generation and injection from those regions of the surface between the inner and outer P+ regions by reducing the gain experienced by these injection carriers.

SUMMARY OF THE INVENTION

An avalanche photodiode includes active and neighboring regions of first conductivity type adjacent to a first major surface of a semiconductor body of first conductivity type, with a gap region therebetween. A channel extends a distance into the semiconductor body from a portion of the second opposed major surface opposite the gap region. A first region of second conductivity type extends into the body a distance from the second opposed major surface including the channel. A second region of the first conductivity type extends a further distance into the body thereby forming the P-N junction which extends a further distance into the second region over the channels than over the remainder of the first region. The first type conductivity modifier concentration in the second region is less at the P-N junction in the portion thereof over the channel. Thus, the local gain at that portion of the junction is correspondingly less.

The invention is also an improved method of making an avalanche photodiode wherein the improvement comprises forming a channel extending a distance into the semiconductor body from a portion of a major surface thereof opposite the gap between the active and neighboring regions. This step is performed after the step of forming the second region and before the step of forming the first region.

DETAILED DESCRIPTION OF THE PREFERRED EMBODIMENT

Figure 1:
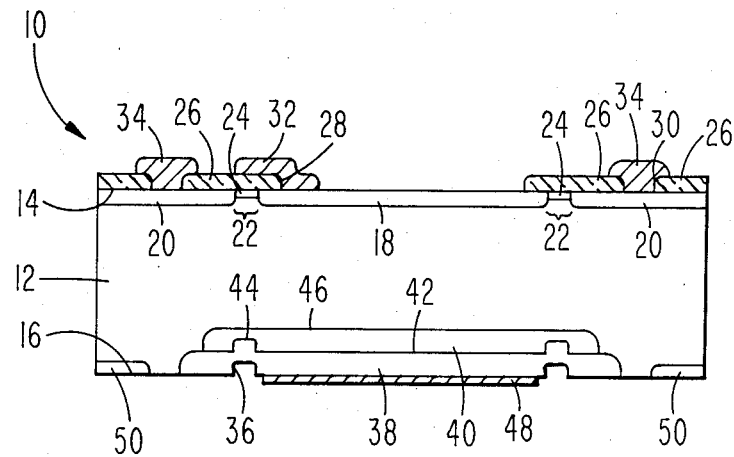
FIG. 1 is a cross-sectional view of an avalanche photodiode of the invention.

In FIG. 1 an avalanche photodiode 10 includes a substrate 12 of first conductivity type having first and second major surfaces 14 and 16, respectively. An active region 18 of first conductivity type extends a distance into the semiconductor body from the first major surface 14. A neighboring guard-band region 20 of first conductivity type, spaced-apart from the active region 18 by a gap region 22, also extends a distance into the semiconductor body from the first major surface 14. A doped gap region 24 of first conductivity type extends a distance into the gap region 22 from the first major surface 14. An electrically insulating layer 26 having an active contact opening 28 and a guard-band contact opening 30 extending therethrough overlies the first major surface 14. An active region contact 32 overlies the active region 18 in the active contact opening 28 and a guard-band electrical contact 34 overlies the guard-band region 20 in the guard-band contact opening 30.

A channel 36 extends a distance into the semiconductor body from the second major surface 16 opposite the gap region 22. A first region 38 of second conductivity type extends a distance into the body 12 from the second major surface 16 and from the surface of the channel 36. A second region 40 of first conductivity type extends a further distance into the body 12 forming a P-N junction 42 including a non-planar portion 44 thereof over the channel 36. The second region 40 has a substantially planar interface 46 with the adjacent portion of the semiconductor body 12 including the portion thereof over the non-planar portion 44 of the P-N junction. A first electrical contact 48 overlies the second major surface 16 and provides electrical contact to the first region 38. A channel stop region 50 spaced-apart from the first region 38 extends a distance into the body 12 from the second major surface 16.

The substrate 12 typically has $\pi$-type conductivity with a resistivity of between about 500 and 10,000 ohm-cm and preferably about 3,000 ohm-cm. The active region 18 and the guard-band region 20 extend a distance between about 0.5 and 1 micrometers ($\mu$m) into the body and typically have a surface concentration between about $10^{19}$ and $10^{20}/cm^3$ acceptors, typically boron, formed by diffusion from a boron nitride source at 1000° C. for about 30 minutes. The gap region 22 is typically about 25 $\mu$m wide at the first major surface 14. The doped gap region 24 typically extends about 0.5 $\mu$m into the gap region 22 from the first major surface 14 and is typically formed by ion implantation of boron ions at an areal dose of between about 0.5 and $2\times10^{11}/cm^2$. The electrically insulating layer 26 is typically formed by a standard thermal oxidation step followed by pyrolytic deposition of silicon nitride. The active region contact 32 and the guard-band contact 34 are formed by sequential deposition of chromium and gold.

The second region 40 is formed prior to the formation of the channels 36 and the first region 38 typically by ion implantation of an acceptor such as boron at an areal dose of about $5\times10^{12}/cm^2$ at an energy of 100 Kev followed by a drive in diffusion such that the second region 40 extends a distance between about 15 and 40 $\mu m$ to the substrate 12 from the second major surface 16. The channel 36 typically extends a distance between about 1 and 2 $\mu m$ into the substrate from the second major surface 16 and has a width which is comparable to the width of the gap region 22. The channel 36 is formed using standard photolithographic and etching techniques, including a mixture of nitric acid, hydrofluoric acid and water in the proportions 65:5:30 as the etchant solution. The first region 38 is then formed by diffusion of a donor, typically phosphorus, from a phosphorus doped oxide deposited on the second major surface 16. The phosphorus concentration is approximately $10^{19}/cm^3$ at the second major surface 16. The first region 40 extends a distance of about 6 $\mu m$ into the substrate from the second major surface 16 and the surface of the channel 36. The channel stop region 50 is typically formed using standard photolithographic, deposition and diffusion techniques and contain acceptors, typically boron, having a concentration at the surface 16 between about $10^{19}$ and $10^{20}/cm^3$. The first electrical contact 48 is typically composed of sequentially deposited layers of aluminum, chromium and gold. An appropriate surface passivation layer on the remainder of the second major surface 16 is not shown. The active region contact 32, the guard-band contact 34, and the first electrical contact 48 comprise a means for providing electrical contact to the semiconductor body 12. The channel 36 is a means for providing a P-N junction 44 at a non-uniform depth into the body 12 from the second major surface 16.

While the conductivity types of the body 12 and the different regions has generally been described in terms of particular conductivity types, it is to be understood that any region may have the opposite conductivity type so long as the relationship between the conductivity types of the different regions is maintained. In addition, the relative magnitude of the impurity concentrations are such that the semiconductor body 12 is most lightly doped, the doped gap region 24 and the second region 40 have an impurity concentration greater than the semiconductor body 12 and the active region 18 and the guard-band region 20 typically have a greater concentration of impurities than that of the second region 40. The second region 40 extends a substantially uniform distance into the body 12 from the second major surface 16 and has a substantially planar interface with the body 12 opposite the active region 18 and the gap region 22. The second region 40 typically has a Gaussian-like conductivity modifier concentration profile with distance from the second major surface 16. The first region 38 extends a greater distance into the body 12 over the channel 36 than over the remainder of the second major surface 16. The concentration of first type conductivity modifiers in the second region 40 at the nonplanar portion 44 of the P-N junction 42 is less than that at the remainder of the P-N junction 42. Because of this, the electric field in the second region 40 at the nonplanar portion 44 will be less than at the planar portion of the P-N junction 42 with a resultant decrease in the local gain as compared to the planar portion of the P-N junction 42. The electrical charge generated over the channel 36, in particular from the gap region 22 opposite the channel 36, will be multiplied to a much lesser extent than charge generated between the planar portion of the P-N junction 42 and the active region 18, thereby reducing the electrical noise from spurious carrier generation.

Figure 2:
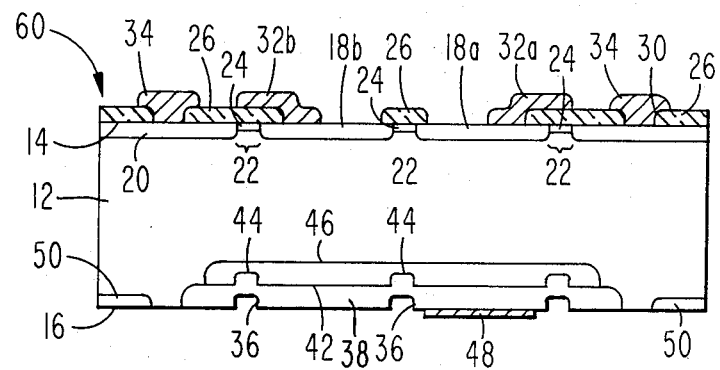
FIG. 2 is a cross sectional view of an avalanche photodetector array of the invention.

While the invention has been illustrated by a single element avalanche photodiode having an active region and a closely spaced adjacent guard-band region separated by a gap region with a channel positioned opposite to the gap region, it is to be understood that the invention also includes other device types and geometries. For example, the invention is also applicable to an array of active regions of the same conductivity type spaced apart by gap regions with channels positioned opposite to each gap region. For example, in FIG. 2, an avalanche photodiode array 60 includes two active regions 18a and 18b spaced apart from one another by a gap region 22 which includes a doped gap region 24. The active regions 18a and 18b are also spaced apart by gap regions 22 from the guard-band region 20. Channels 36 extend a distance into the substrate 12 from portions of the second major surface 16 opposite to each of the gap regions 22.

We claim:

1. An avalanche photodiode comprising
   a semiconductor body of a first conductivity type having first and second opposed major surfaces;
   a first active region of said first conductivity type extending a distance into said body from said first major surface and spaced apart by a gap region from a neighboring region of the same conductivity type which also extends a distance into said body from said first major surface;
   a channel extending a distance into said body from a portion of said second major surface opposite said gap region;
   a first region of said second conductivity type extending a distance into said body from said second major surface including the portion thereof opposite said first active region and from the surfaces of said channel;
   a second region of said first conductivity type extending a distance into said body from said first region; and
   electrical contacts to said active and first regions;
   wherein the interface between said second region and the remainder of said body has a substantially planar portion opposite to said first active and gap regions; and
   wherein a P-N junction between said first and second regions includes a substantially planar portion opposite said first active region and an adjacent nonplanar portion over said channel.

2. The photodiode of claim 1 further comprising an electrical contact to said neighboring region.

3. The photodiode of claim 2 further comprising a doped gap region of said first conductivity type extending a distance into said gap region from said first major surface.

4. The photodiode of claim 3 wherein said neighboring region extends around said active region.

5. The photodiode of claim 1 further comprising a second active region between said first active and said neighboring regions and spaced apart from said first active and neighboring regions by gap regions and further comprising channels extending into said body from said second major surface opposite each of said gap regions.

* * * * *